June 9, 1959 F. L. GOODWIN, JR 2,890,390
MODULE
Filed March 16, 1956 2 Sheets-Sheet 1

INVENTOR.
Francis L. Goodwin Jr.
BY
Donald P. Smith
Attorney

June 9, 1959 F. L. GOODWIN, JR 2,890,390

MODULE

Filed March 16, 1956 2 Sheets-Sheet 2

INVENTOR.
Francis L. Goodwin Jr.

BY

Donald P. Smith
Attorney

United States Patent Office 2,890,390

Patented June 9, 1959

2,890,390

MODULE

Francis L. Goodwin, Jr., Silver Spring, Md., assignor to ACF Industries, Incorporated, New York, N.Y., a corporation of New Jersey Application March 16, 1956, Serial No. 571,962

7 Claims. (Cl. 317—101)

This invention relates generally to circuitry and more particularly to the type of circuitry utilizing the modular concept.

In connection with the modern mass production of electronic equipment the modular technique has been developed. One type of module comprises a plurality of wafers or plates arranged parallel one to another and held fixed together by means of an assemblage of conductive riser wires fixed in notches about the periphery of the plate, and soldered thereto. The purpose of the stack of plates is to provide surfaces on which to accommodate electrical components and the risers are used to afford conductors to which external wiring may be connected and also to act as mechanical supports for the plates. The module is an easily handled unit and has been shown to be quite versatile in use. The units are currently being fabricated with any number of plates, depending upon the number and kind of electrical components to be supported and the particular circuit application of the element. In general, modules are used with printed circuitry wherein conductive paths are formed by electrodeposition on an insulating planar board and modules are fixed to the board by passing the riser wires through holes formed therein to communicate with selected conductors, the riser wires being thereafter bent back upon themselves and soldered or otherwise secured to the conductive paths.

As will be readily appreciated it is sometimes necessary to replace an individual wafer in a module when the same is found to be defective. This invention provides a novel method and structure for the substitution of a defective wafer or series of wafers, as will hereinafter be described. In general, however, the replacing wafer carries exactly the circuit component which are disposed on the wafer to be discarded. Summarily stated, the replacement wafer is a structure having a plurality of sleeves disposed in spaced notches around its periphery to receive the risers when they have been severed to remove the defective unit.

It is accordingly an object of this invention to provide a new module wafer repair structure.

It is a further object of this invention to provide a novel method of replacing an individual wafer in a module.

It is a still further object of this invention to improve on the module wafer replacement method now in use.

Other objects and advantages will be in part obvious and in part pointed out in the following specification taken in connection with the drawing in which.

Figure 1:
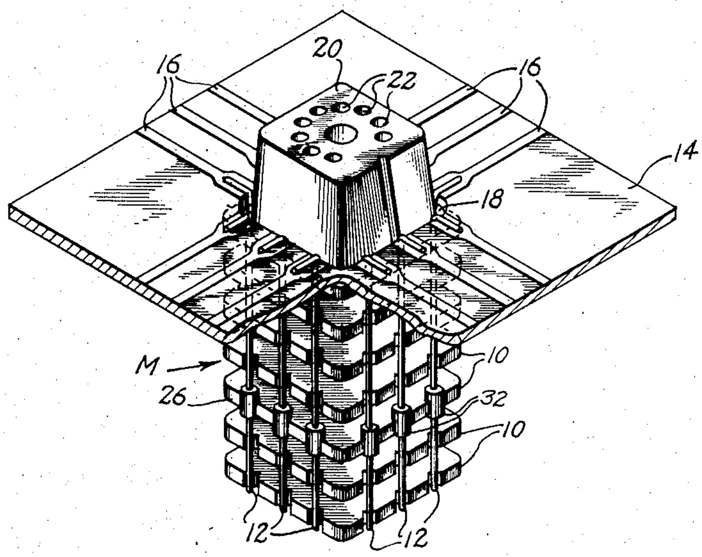
Figure 1 is a perspective view showing a fragment of a printed circuit board having a module connected thereto embodying the present invention.

Referring now to the drawing wherein like reference characters designate like or corresponding parts throughout, a module M is illustrated in Figure 1, to consist of a plurality of wafers 10 held in spaced apart relation by an assemblage of conductive riser wires 12. The wires are disposed in kerfs formed at the edge of the plate and are bonded thereto by soldering or any other suitable method. A printed circuit panel 14 is provided for electrically interconnecting electronic stages represented by the several modules and for physically supporting the same. Conductive paths 16 are formed upon the circuit panel by any of a number of well-known methods and the module is secured to the panel by forming an aperture 18 therein, passing the riser ends through the same, bending the riser ends back upon themselves to interlock with the aperture edges and connect with the interrupted conductive paths, substantially as shown, and soldering the riser ends to the paths. A tube socket 20 having the usual cavities 22 for receiving tube contact pins may be carried upon the top wafer of the module and will then penetrate the aperture formed in the panel. However, as will be understood the provision of the tube and socket is entirely optional, depending on the demands and design of the circuit. The several wafers are depended upon to carry electrical components so that a module in the form shown in Figure 1 represents a complete stage of an electronic system, the resistors, inductors, capacitors and the like being carried on or between the parallel wafers and connected to the risers which serve to interconnect them with the vacuum tube in its socket and with external circuitry.

Modules are structures that lend themselves readily to fabrication by automatic machinery and it sometimes happens that an assembled module is complete and satisfactory in all respects except for a single doubtful component carried on one of the wafers. In this connection, there has been found desirable, from an economic viewpoint to replace the wafer carrying the defective or doubtful component by a member which can be easily inserted into the module wafer system.

Figure 2:
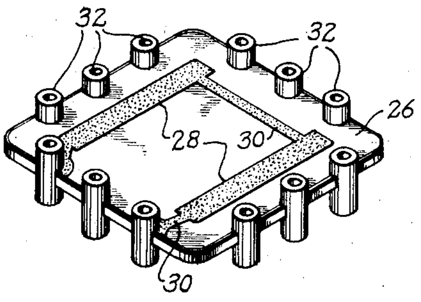
Figure 2 is a perspective view of the wafer member in accordance with the present invention.
Figure 3:
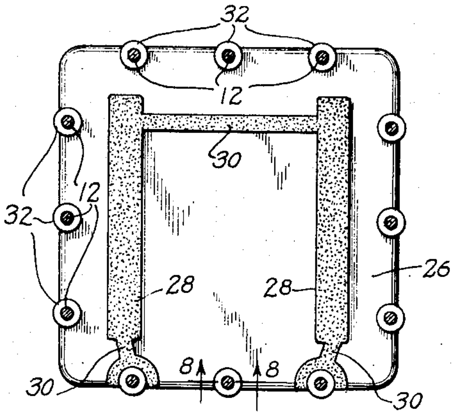
Figure 3 is a section view taken along line 3—3 of Figure 7.
Figure 4:
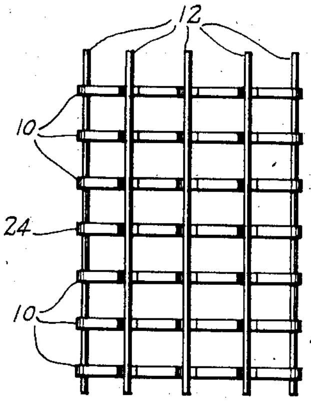
Figures 4, 5 and 6 and 7 are elevation views showing in sequence the several steps used in replacing a defective wafer in accordance with the present invention.
Figures 5, 8:
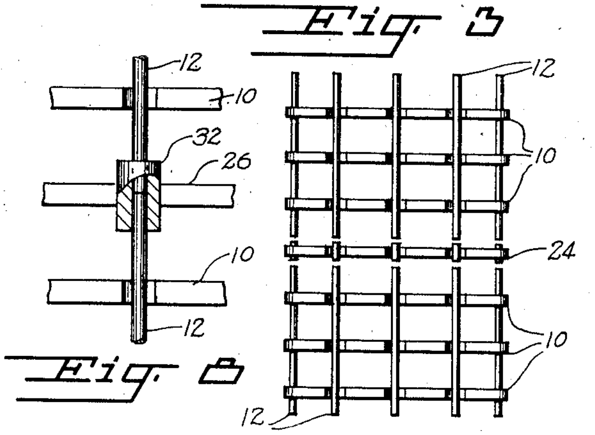
Figure 8 is an enlarged elevation view partly in section taken on line 8—8 of Figure 3 and looking in the direction of the arrows.
Figure 6:
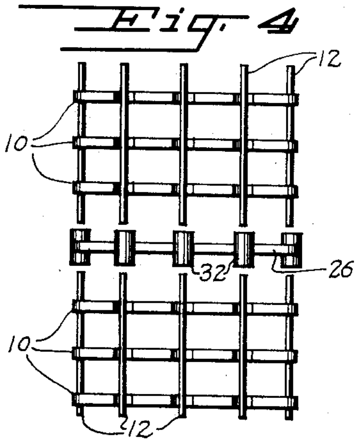
Figure 7:
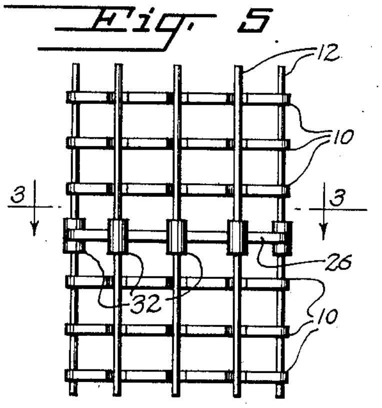

Attention is now directed to Figure 4 where the completed module there shown is assumed to have a wafer 24 defective in some electrical or mechanical fashion. Let it be assumed that one of the resistors carried thereon is of such value that the circuit does not function. The method, then, of replacing the module wafer comprises the steps of severing the assemblage of risers 12 above and below the wafer to be replaced as is shown in Figure 5. The defective wafer is then removed from the stack and an identical wafer carrying components as is shown in Figure 2 is placed in the position occupied by the discarded element (see Figure 6); the riser assemblages are forced into the riser receiving portion of the element as seen in Figure 7 and are there soldered or otherwise firmly secured. Figure 7 then represents the repaired module and ready for use. The replacement wafer illustrated in Figures 2 and 3 comprises a planar member, 26 having a series of kerfs equally spaced about the periphery thereof and receiving sleeves 32 wherein the longitudinal axes of the sleeve form a right angle with the plane of the member to align with the riser assemblage. In the illustrated embodiment resistors 28 are shown carried on one surface of the wafer and metal conductive paths 30 are shown interconnecting between the resistors and the sleeves for connection into an external circuit. The replacement is an exact, and pretested duplicate of the doubtful assembly to be discarded and, once assembled by the method here shown, enables the module to be used at once and assembled into a printed circuit panel as described supra.

Figure 8 shows an enlarged detail of a sleeve element as it receives the severed ends of the conductive risers 12. It will be readily appreciated, upon inspection thereof that the risers are urged into the sleeve in telescopic relation to abut one against another for soldering.

Figure 9:
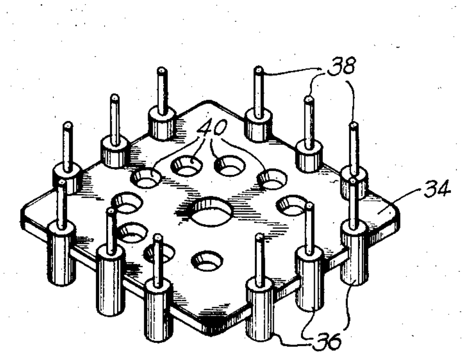
Figure 9 is a perspective view showing a modification of the wafer of Figure 2
Figure 10:
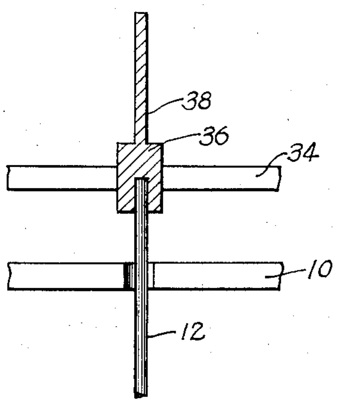
Figure 10 is an enlarged view showing the detail of the modification of Figure 9.

Figure 9 shows a modification of the wafer of Figure 2 in that it is intended for use to replace a defective or doubtful top module wafer. This species shows a member 34 having a series of kerfs formed above the periphery thereof to receive a plurality of elements 36 which are formed hollow to receive at one end thereof the conductive risers. A longitudinal portion 38 of reduced diameter forms a right angle with the plane of the wafer 34. A series of apertures 40 are disposed in a substantially circular configuration to receive in penetrating relationship the several pins depending from a tube socket. If then, the top wafer of a module be defective it is a simple matter to replace the same following the steps of the enumerated method, above. The defective wafer is first severed from the module. The wafer of Figure 9 will accept a tube socket, the several pins penetrating the disclosed apertures and being bent back upon themselves on the other surface to communicate with the risers. The assemblage of members 36 are forced over the respective ends of the severed risers substantially as shown in Figure 10 and soldered therein. Now the module is ready for assembly into the printed circuit panel. Following the procedure set out above the portions 38 of reduced diameter are passed through the preformed aperture in the printed circuit panel and are bent back upon themselves to lock with the aperture edge. They are thereafter soldered to the ends of the interrupted circuit conductors. An examination of Figure 10 discloses that the riser wires 12 are received in close fitting contact within members 36 and represent the full equivalent of the defective rejected structure.

Substantial savings in rejected modules have been realized by the use of the method and structure shown herein and it will be seen from the foregoing disclosure that the above mentioned object of the invention are admirably fulfilled. It is to be understood that the foregoing is given by way of illustrative example only rather than by way of limitation and without departing from the invention the details may be varied within the scope of the appended claims.

What I claim is:

1. That method of replacing wafers in a module comprising a stack of wafers disposed in spaced parallel planes carrying electrical components and joined by a plurality of conductive risers forming a right angle with the planes, which comprises the steps of severing the risers immediately adjacent the wafers to be discarded, removing the wafers from the stack, inserting an assembly of substitute wafers carrying electrical components into the position occupied by the removed wafers, inserting the riser assemblage into a portion of the substituted wafer assembly, and soldering the risers into the said wafer portion.

2. The method of replacing an individual wafer in a module comprising a stack of wafers disposed in spaced parallel planes and joined by a plurality of conductive risers forming a right angle with the planes which comprises the steps of severing the risers above and below the wafer to be discarded, removing the wafer from the stack, inserting a substitute wafer into the position formerly occupied by the removed wafer, inserting the assemblage of risers into a portion of the substitute wafer and soldering the risers into the said wafer portion.

3. A replacement component for a module formed of an aligned stack of spaced planar wafers disposed in parallel planes and joined by an assemblage of conductive riser wires arranged perpendicularly to the planes of said wafers, said replacement component comprising a planar wafer member having a plurality of kerfs formed in the periphery thereof and in the same arrangement as said riser wires, a plurality of tubular sleeves having both ends open secured to said planar wafer member with a different one of said sleeves fixed in each kerf and with each longitudinal axis of said sleeves forming a right angle with the plane of said wafer member, and means forming conductive paths on said wafer member connected to at least one of said tubular sleeves for connecting circuit components thereto.

4. A replacement component for a module formed of an aligned stack of spaced planar wafers disposed in parallel planes and joined by an assemblage of conductive riser wires arranged perpendicularly to the planes of said wafers, said replacement component comprising a dielectric planar wafer member having a plurality of uniformly spaced kerfs in the periphery thereof and having the same arrangement as said riser wires, means forming conductive paths on said wafer member connected to at least one of said tubular sleeves for connecting circuit components thereto, a plurality of metallic tubular sleeves having both ends open and joined by a continuous passageway, said sleeves being secured to said planar wafer member with a different one of said sleeves fixed in each kerf and with each longitudinal axis of said sleeves forming a right angle with the plane of said wafer member, whereby said replacement component can replace any one of said spaced wafers of said module with the ends of said riser wires connected to adjacent ones of said module wafers extending into one or both ends of each of said tubular sleeves connected to said wafer member.

5. The method of replacing an individual wafer in a module comprising a stack of wafers disposed in spaced parallel planes and joined by a plurality of conductive riser wires each forming a right angle with the planes of said wafers, said method comprising the steps of, severing the riser wires above and below the wafer to be discarded, removing the wafer from the stack, substituting a replacement wafer in the position formerly occupied by the removed wafer, inserting the severed ends of each of said riser wires into a portion of the replacement wafer and fixing the riser wires to said wafer portion.

6. The method of replacing an individual wafer in a module assembly comprising a plurality of wafers disposed in spaced parallel planes and joined by an arrangement of a plurality of conductive riser wires each forming a right angle with the planes of said wafers, said method comprising the steps of, severing the riser wires above and below the wafer to be discarded, removing the wafer from the stack, substituting a replacement wafer having a plurality of hollow tubular sleeves with the arrangement of said riser wires into the position formerly occupied by the removed wafer, and fixing the severed ends of each riser wire into opposite ends of a different one of said hollow sleeves.

7. The method of placing an individual wafer in a module assembly comprising a plurality of wafers disposed in spaced parallel planes and joined by an arrangement of a plurality of conductive riser wires each forming a right angle with the planes of said wafers, said method comprising the steps of severing the riser wires on at least one side of the wafer to be discarded, removing the wafer from the module, substituting a replacement wafer having a plurality of hollow tubular sleeves with the arrangement of said riser wires into the position formerly occupied by the removed wafer, threading the end of each riser wire through a different one of said hollow sleeves, and fixing each riser wire to its respective sleeve.

References Cited in the file of this patent

UNITED STATES PATENTS

| | | |
|---|---|---|
| 2,446,701 | Greene | Aug. 10, 1948 |
| 2,515,638 | Doucette | July 18, 1950 |
| 2,616,994 | Luhn | Nov. 4, 1952 |
| 2,649,513 | Luhn | Aug. 18, 1953 |
| 2,774,014 | Henry | Dec. 11, 1956 |
| 2,786,969 | Blitz | Mar. 26, 1957 |

OTHER REFERENCES

Mass Production of Electronic Subassemblies; Electrical Manufacturing, October 1954; pp. 134–137.